(12) United States Patent
Yamashita et al.

(10) Patent No.: US 7,019,336 B2
(45) Date of Patent: Mar. 28, 2006

(54) SEMICONDUCTOR DEVICE AND METHOD FOR MANUFACTURING THE SAME

(75) Inventors: Yoshimi Yamashita, Kawasaki (JP); Akira Endoh, Kawasaki (JP); Keiji Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/871,049

(22) Filed: Jun. 21, 2004

(65) Prior Publication Data

US 2005/0059197 A1 Mar. 17, 2005

(30) Foreign Application Priority Data

Sep. 11, 2003 (JP) ............................. 2003-320071

(51) Int. Cl.
*H01L 29/88* (2006.01)
*H01L 29/861* (2006.01)

(52) U.S. Cl. .................. 257/104; 257/745; 438/168

(58) Field of Classification Search ............... 257/104, 257/109, 745, 746; 438/169, 172, 191, 262, 438/265
See application file for complete search history.

(56) References Cited

U.S. PATENT DOCUMENTS 6,166,417 A * 12/2000 Bai et al. .................... 257/407

6,521,998 B1 * 2/2003 Teraguchi et al. .......... 257/745

FOREIGN PATENT DOCUMENTS

| JP | 62-169483 | 7/1987 |
|---|---|---|
| JP | 10-209177 | 8/1998 |
| JP | 11-67793 | 3/1999 |
| JP | 2003-100775 | 4/2003 |

* cited by examiner

*Primary Examiner*—Phuc T. Dang
(74) *Attorney, Agent, or Firm*—Westerman, Hattori, Daniels & Adrian, LLP

(57) ABSTRACT

In a nitride-system semiconductor, being different from GaAs and Si, Schottky barrier heights $\Phi_B$ change significantly against work functions $\Phi_M$ of metals. Then, for example, on an HEMT in which a buffer layer and a barrier layer constituted by nitride-system semiconductors are sequentially formed on a substrate, and a gate electrode is formed on the barrier layer, when a metal having a relatively large work function $\Phi_M$ is selected as a metal constituting the gate electrode, and the thickness of the barrier layer is adjusted so that the Schottky barrier height $\Phi_B$ becomes larger as compared to a semiconductor surface potential $\Phi_S$ on both sides of the gate electrode, a two-dimensional electron gas cannot exist below the gate electrode even when no recess is formed on a portion immediately beneath the gate electrode on the barrier layer, so that the enhancement operation becomes possible.

20 Claims, 8 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2003-320071, filed on Sep. 11, 2003, the entire contents of which are incorporated herein by reference.

BACKGROUND OF THE INVENTION

1. Field of the Invention

The present invention relates to a semiconductor device having a high electron mobility transistor (HEMT), and a method for manufacturing the same.

2. Description of the Related Art

In recent years, a high speed device using a wide gap semiconductor is attracting attention as a power device for mobile communication. A nitride-system semiconductor represented by gallium nitride (GaN) is a material having a small influence on environment, since it does not include arsenic. Further, the band gap of the nitride-system semiconductor is large as 3 eV or more, and breakdown electric field thereof is $2 \times 10^6$ V/cm, which is larger as compared to that of GaAs. Furthermore, the electron speed of the nitride-system semiconductor is approximately the same as that of GaAs ($2 \times 10^7$ cm/s), and a discontinuous portion having a larger band exists at a hetero-interface. Furthermore, in the nitride-system semiconductor, a high two-dimensional electronic concentration ($1 \times 10^{13}$ cm$^{-2}$) can be generated by piezoelectric effect. Further, regarding a substrate material, the nitride-system semiconductor can be grown on a sapphire substrate, which can be made large in area and has a small high-frequency loss, or even on an SiC substrate, which has excellent thermal conduction. Thus, the nitride-system semiconductor has many excellent capabilities as a semiconductor material for power devices.

Regarding such a nitride-system semiconductor material, especially an AlGaN/GaN-system high electron mobility transistor (HEMT), research and development thereof as a high-output power device for mobile communication have been accelerated in recent years, and even a device of a scale for outputting 100 W, which has a high-output capability that is ten times more as compared to a conventional GaAs-system power device, is being developed.

However, there is no HEMT of an enhancement type (normally-off operation) that is stable and easy to manufacture.

Prior arts are disclosed in Japanese Patent Application Laid-open No. 2003-100775, Japanese Patent Application Laid-open No. Hei 11-67793, Japanese Patent Application Laid-open No. Hei 10-209177, and Japanese Patent Application Laid-open No. Sho 62-169483.

SUMMARY OF THE INVENTION

The present invention provides a semiconductor device which can be easily manufactured and has an HEMT capable of performing enhancement operation, and a method for manufacturing the same.

As a result of earnest studies to solve the above-described problems, the inventors of the present invention have devised aspects of the invention described below.

A semiconductor device according to the present invention comprises: a first compound semiconductor layer; a nitride-system second compound semiconductor layer (a semiconductor layer of nitrogen compound, for example) formed on the first compound semiconductor layer via a hetero junction; a gate electrode formed on the second compound semiconductor layer via a hetero junction; and a source electrode and a drain electrode formed sandwiching the gate electrode. The present invention is characterized in that a thickness of the second compound semiconductor layer is equal to or less than a thickness determined according to a work function of the metal constituting the gate electrode.

In a method for manufacturing a semiconductor device according to the present invention, a first compound semiconductor layer is formed, and thereafter a nitride-system second compound semiconductor layer is formed on the first compound semiconductor layer via a hetero junction. Next, a gate electrode is formed on the second compound semiconductor layer via a Schottky junction. A thickness of the second compound semiconductor layer is equal to or less than a thickness determined according to a work function of the metal constituting the gate electrode.

DETAILED DESCRIPTION OF THE PREFERRED EMBODIMENTS

Conventionally, a gallium nitride HEMT that is mainly developed is a depletion type (normally-on operation), in which electric current flows even when a gate input signal voltage is not applied, and with a purpose of large electric current operation based on this operation mode, development of the high-output power device is conducted.

On the other hand, regarding the HEMT of an enhancement type (normally-off operation), in which electric current does not flow when the gate input signal voltage is not applied, there is an HEMT using GaAs or InP in which a threshold voltage is adjusted by a dig-in processing immediately beneath the gate.

Under such a current situation, when ultra high-speed/low power consumption capabilities and application to a large-scale analog/digital element of the gallium nitride HEMT in the future are taken into account, a technique to produce a gallium nitride element for enhancement type operation is desired, but it is extremely difficult to perform dig-in processing immediately beneath the gate for the nitride-system semiconductor. For example, when a wet-etching method is employed for producing an enhancement element having a recess structure such that an area immediately beneath the gate is dug in, crystalline etching of AlGaN, GaN or the like is almost impossible. Further, when a dry-etching method is employed, damage will occur on the semiconductor while processing, which causes unstable operation and/or difficulty in control of operation.

The present invention resolves the problems as described below.

Hereinafter, embodiments of the present invention will be specifically described with reference to the attached drawings.

Basic Principles of the Present Invention

Figure 1:
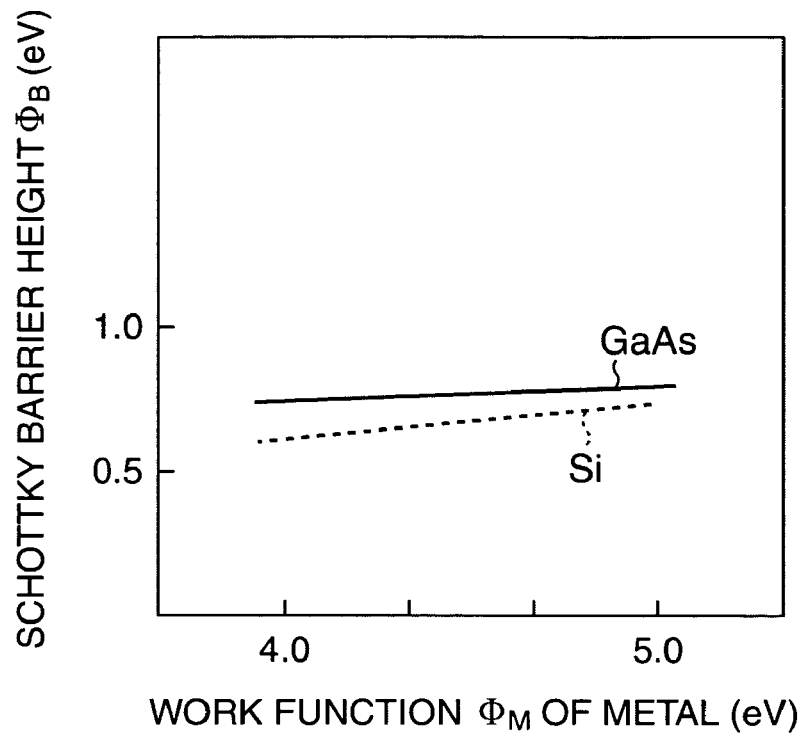
FIG. 1 is a graph showing a relationship between work functions and Schottky barrier heights of Si and GaAs.

First, basic principles of the present invention will be described. As shown in FIG. 1, characteristics of Schottky barrier heights $\Phi_B$ for work functions $\Phi_M$ inherent to respective metal materials in a gallium arsenic (GaAs) semiconductor and in a silicon (Si) semiconductor are experimentally reported. According to this, gradients for the work functions $\Phi_M$ of metals for both of the GaAs and the Si are gradual. For example, the gradient coefficient S ($\Phi_B/\chi$) of the GaAs is 0.1 or less. Specifically, these Schottky barrier heights $\Phi_B$ have low dependence on the type of a metal material, and thus the Schottky barrier heights $\Phi_B$ are substantially constant. Generally, such a phenomenon is considered to be caused by that a surface level having a high density exists on a surface of the semiconductor material due to an inherent electronic defect or the like, and the Fermi-level of an electron is pinned by this surface level. Incidentally, even when the horizontal axis is electronegativity $\chi$, a graph having the same tendency as the graph shown in FIG. 1 can be obtained.

Figure 2:
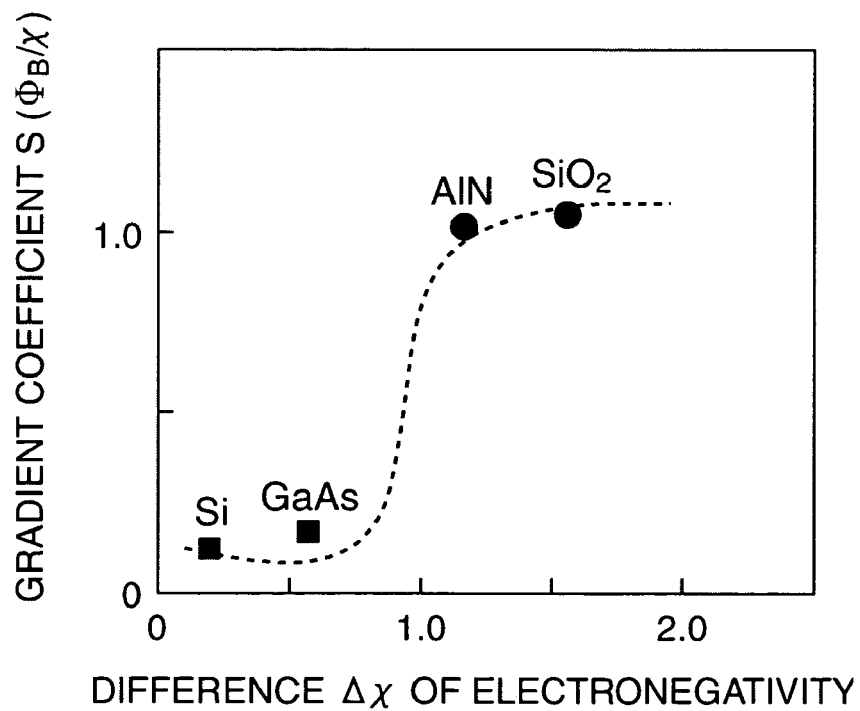
FIG. 2 is a graph showing a relationship between a difference of electronegativity and a gradient coefficient.

On the other hand, for the nitride-system semiconductor material, difference $\Delta\chi$ of electronegativity which the element constituting the material has is 1 or more, which is extremely larger in comparison to the GaAs and the Si, and as shown in FIG. 2, it is known that the gradient coefficient S ($\Phi_B/\chi$) thereof is approximately 1, similarly to an insulating film and the like.

Figure 3:
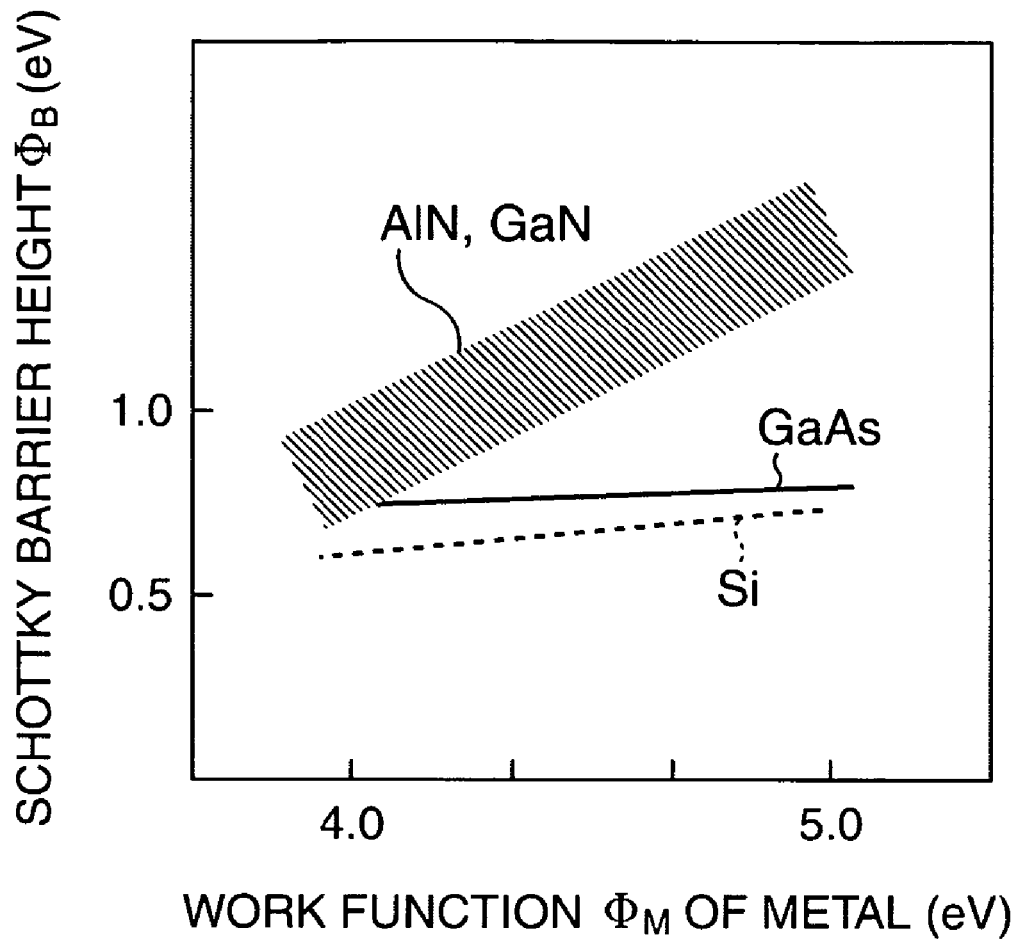
FIG. 3 is a graph showing a relationship between work functions and Schottky barrier heights of AlN and GaN.
Figure 4:
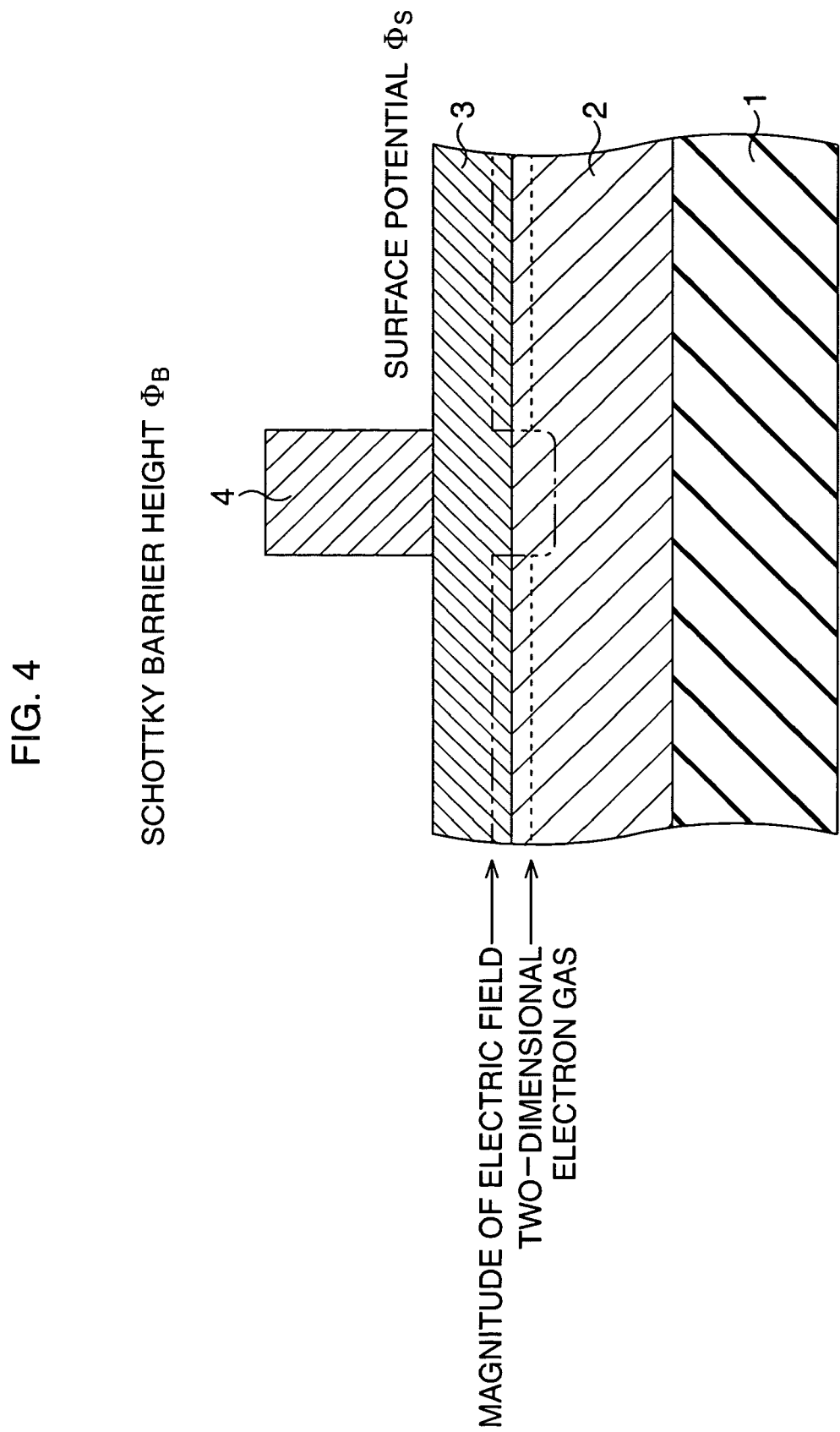
FIG. 4 is a cross-sectional view showing a mechanism of the present invention.

Then, when the inventors of the present invention focused attention on such gradient coefficients of the nitride-system semiconductor and studied relationships of work functions $\Phi_M$ of metals and Schottky barrier heights $\Phi_B$, which is like to that shown in FIG. 1, the inventors found out that the Schottky barrier heights $\Phi_B$ change significantly against the work functions $\Phi_M$ of the metals as shown in FIG. 3, which is different from the GaAs and the Si. The present invention is based on this finding, and appropriately uses a large difference $\Delta\chi$ of electronegativity which the nitride-system semiconductor inherently has, thereby realizing the enhancement operation in an HEMT. For example, as shown in FIG. 4, on an HEMT in which a buffer layer 2 and a barrier layer 3 constituted by the nitride-system semiconductors are sequentially formed on a substrate 1 and a gate electrode 4 is formed on the barrier layer 3, when a metal having a relatively large work function $\Phi_M$ is selected as a metal constituting the gate electrode 4, and the thickness of the barrier layer 3 is adjusted so that the Schottky barrier height $\Phi_B$ becomes larger as compared to the semiconductor surface potential $\Phi_S$ on both sides of the gate electrode 4, a two-dimensional electron gas cannot exist beneath the gate electrode 4 even when no recess is formed on a portion immediately beneath the gate electrode 4 on the barrier layer 3, so that the enhancement operation becomes possible. Incidentally, the surface of the barrier layer 3 may be covered by an insulating film, or may be exposed.

Figure 5:
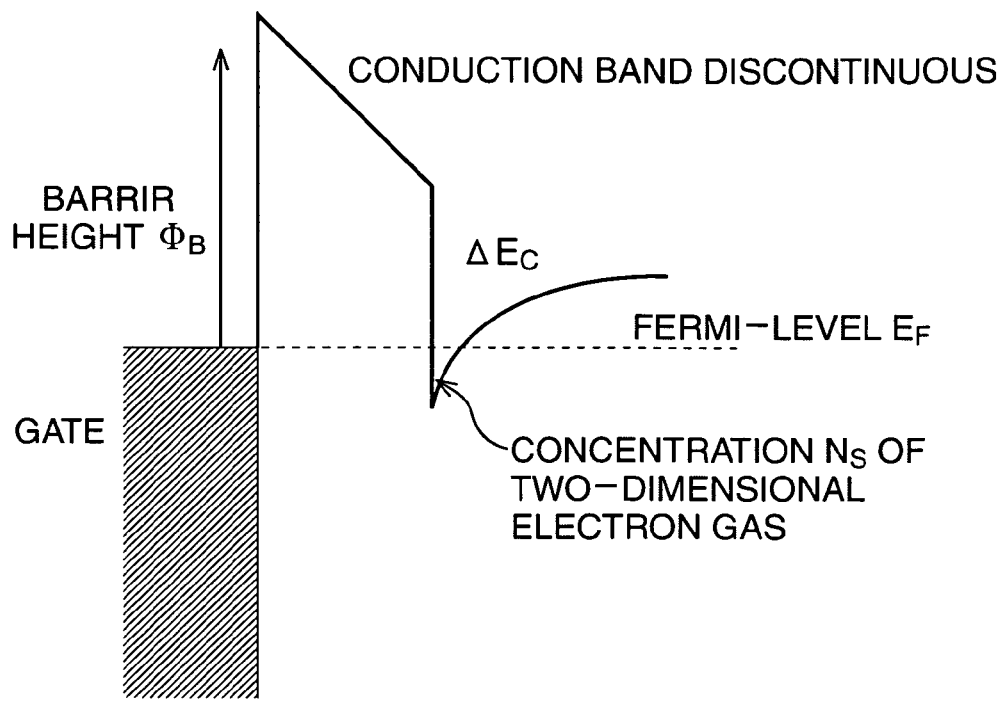
FIG. 5 is a view showing an energy band of an HEMT.

Here, a relationship between a kind of a metal constituting the gate electrode 4 and a thickness of the barrier layer 3 will be described with reference to FIG. 5. When the work function of the metal constituting the gate electrode 4 is $\Phi_M$, and the electronic affinity of a semiconductor constituting the barrier layer 3 is $\gamma$, the Schottky barrier height (potential) $\Phi_B$ of the semiconductor is expressed by the following equation 1.

$$\Phi_B = \Phi_M - \gamma \quad \text{[Equation 1]}$$

Further, when a piezoelectric polarization of the semiconductor is P, a relative dielectric constant is $\kappa$, the thickness of the barrier layer 3 is d, an energy difference of the hetero junction between the buffer layer 2 and the barrier layer 3 is $\Delta Ec$, and an electric charge is q, a threshold voltage $V_{th}$ of the HEMT is expressed by the following equation 2.

$$V_{th} = \Phi_B - \Delta Ec/q - d \times P/\kappa \quad \text{[Equation 2]}$$

Figure 6:
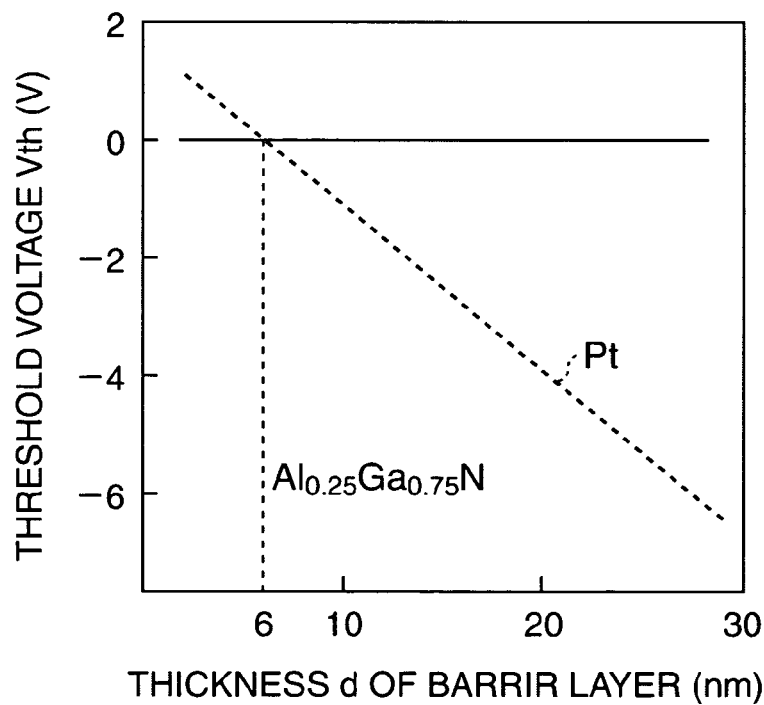
FIG. 6 is a graph showing a relationship between a thickness of a barrier layer and a threshold voltage.

For example, when the buffer layer 2 is constituted by GaN, the barrier layer 3 is constituted by $Al_{0.25}Ga_{0.75}N$, and the gate electrode 4 is constituted by Pt, a relationship between the thickness d of the barrier layer 3 and the threshold voltage $V_{th}$ becomes one shown in FIG. 6. Incidentally, in this case, the work function $\Phi_M$ is 5.7 (eV), the electronic affinity $\gamma$ is 3.63 (eV), the energy difference $\Delta Ec$ is 0.32 (eV), and the relative dielectric constant $\kappa$ is $9.4 \times \epsilon_0$ ($=9.4 \times 8.854 \times 10^{-12}$) (F/m). Under such a condition, when the thickness of the barrier layer 3 is set to approximately 6 nm, the threshold voltage $V_{th}$ becomes approximately 0 (zero) V, so that the enhancement type HEMT can be obtained without adopting the recess structure. Specifically, by appropriately selecting the kind of the metal constituting the gate structure according to the thickness of the barrier layer, the threshold voltage can be easily set. For example, by setting the Schottky barrier height (potential) $\Phi_B$ equal to or larger than a value represented by "$\Delta Ec/q + d \times P/\kappa$", the threshold voltage can be set to 0 (zero) or higher. Then, by setting the thickness of the barrier layer equal to or less than a thickness determined according to the kind of the metal constituting the gate electrode, the enhancement type HEMT can be obtained without forming the recess structure on the barrier layer.

First Embodiment

Figure 7:
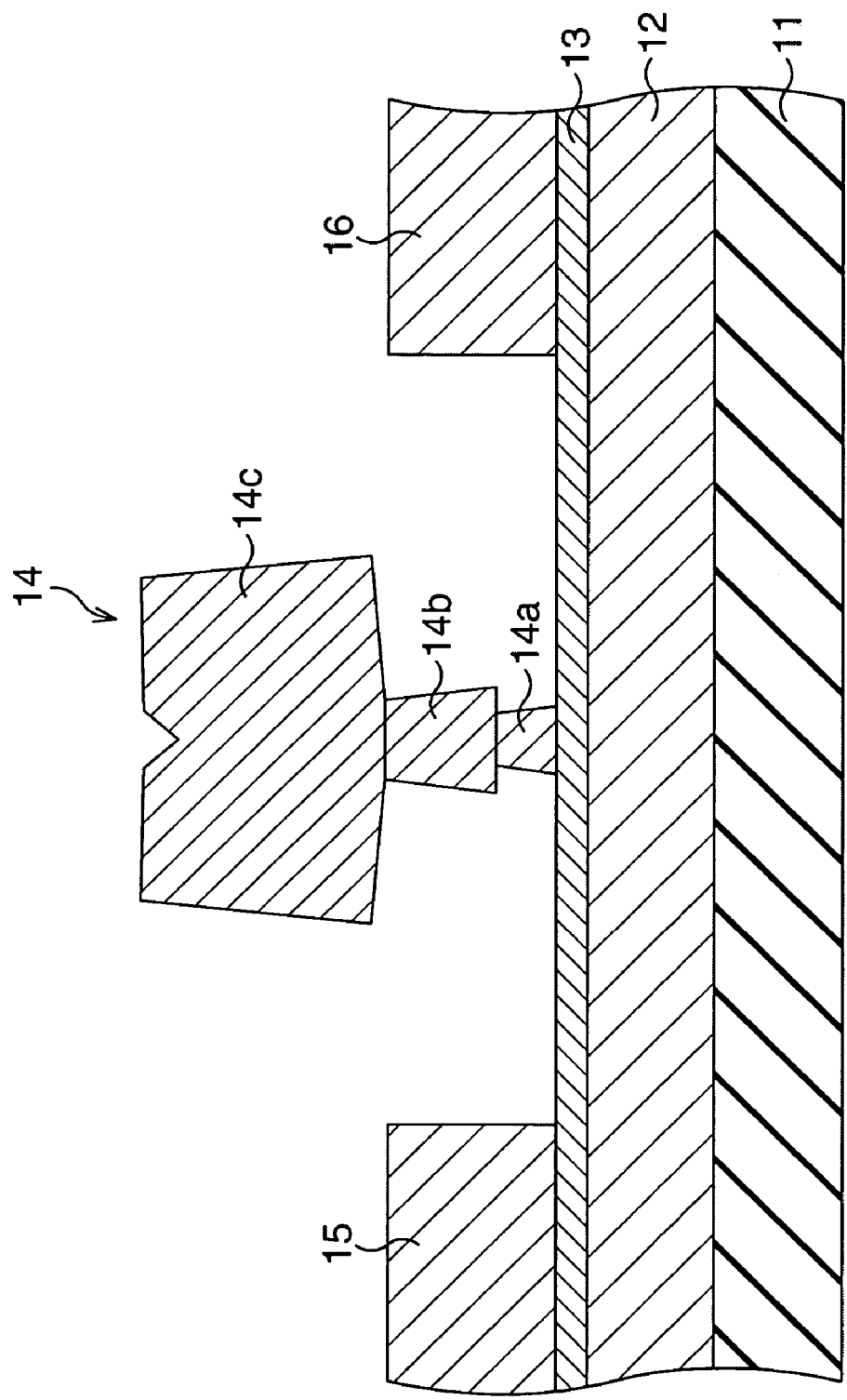
FIG. 7 is a cross-sectional view showing a semiconductor device (HEMT) according to a first embodiment of the present invention.

Next, a first embodiment of the present invention will be described. FIG. 7 is a cross-sectional view showing a semiconductor device according to the first embodiment of the present invention.

In this embodiment, on a sapphire substrate 11 whose plane direction of a surface is (0001), a buffer layer 12 and a barrier layer 13 are sequentially formed via a hetero junction. The buffer layer 12 is constituted by, for example, intrinsic GaN having a high resistance, and a thickness thereof is approximately 2000 nm. Further, the barrier layer 13 is constituted by, for example, intrinsic $Al_{0.25}Ga_{0.75}N$, and a thickness thereof is approximately 10 nm. Incidentally, as will be described later, the vicinity of an interface of the buffer layer 12 with the barrier layer 13 also functions as a channel. The buffer layer 12 and the barrier layer 13 are formed by, for example, the epitaxial growth method. Furthermore, a gate electrode 14 is formed on the barrier layer 13 via a Schottky junction, and a source electrode 15 and a drain electrode 16 are formed so as to sandwich the gate electrode 14 therebetween. The gate electrode 14 is constituted by, for example, an Mo layer 14a, a Pt layer 14b, and an Au layer 14c which are sequentially formed above the barrier layer 13. Further, the source electrode 15 and the drain electrode 16 are constituted by, for example, a Ti layer and an Al layer which are sequentially formed on the barrier layer 13, and the contact resistivity of the source electrode 15 and the drain electrode 16 is approximately $2 \times 10^{-6}$ ($\Omega/cm^2$). Further, on both sides of the gate electrode 14, an AlGaN barrier layer 13 is exposed.

In the first embodiment configured as above, a work function $\Phi_M$ of the Mo constituting the bottom layer of the gate electrode 14 is 4.6 (eV), and the Schottky barrier height $\Phi_B$ of the Mo for the barrier layer 13 is 1.0 (eV), whereas the semiconductor surface potential $\Phi_S$ of the AlGaN constituting the barrier layer 13 is approximately 0.3 to 0.5 (eV). Specifically, the Schottky barrier height $\Phi_B$ is larger than the semiconductor surface potential $\Phi_S$. Accordingly, as shown in FIG. 4, in a state that a voltage is not applied to the gate electrode 14, a two-dimensional electron gas cannot exist in the vicinity of the interface of the buffer layer 12 with the barrier layer 13 beneath the gate electrode 14. On the other hand, when a voltage higher than the threshold voltage is applied to the gate electrode 14, the two-dimensional electron gas exists in the vicinity of the interface of the buffer layer 12 with the barrier layer 13 beneath the gate electrode 14, and this portion (the vicinity of the interface) becomes a channel that allows electric current to flow between the source electrode 15 and the drain electrode 16. In other words, the enhancement operation is performed in the HEMT according to this embodiment.

Further, when the HEMT according to this embodiment is designed, a relationship between the thickness of the barrier layer 13 and the threshold voltage (refer to FIG. 6) for a case that the intrinsic GaN is used as the buffer layer 12, the intrinsic AlGaN is used as the barrier layer 13, and the bottom layer of the gate electrode 14 is the Mo layer 14a is obtained in advance, and based on this relationship, the thickness of the barrier layer 13 is set to 10 nm so that the threshold voltage becomes substantially 0 (zero). Therefore, when a positive voltage is applied to the gate electrode 14, electric current flows between the source electrode 15 and the drain electrode 16.

Thus, in this embodiment, even when dig-in processing for the barrier layer 13 is not performed immediately beneath the gate electrode 14, the enhancement operation is surely performed. Therefore, processing of the barrier layer 13 is not necessary, so that production of such an HEMT is easy.

Furthermore, in this embodiment, since the gate electrode 14 is constituted by the Mo layer 14a, the Pt layer 14b, and the Au layer 14c, thermal stability is high.

Incidentally, the reason of making the width of the Au layer 14 wider than that of the Mo layer 14a and of the Pt layer 14b is to lower a wiring resistance.

Second Embodiment

Figure 8:
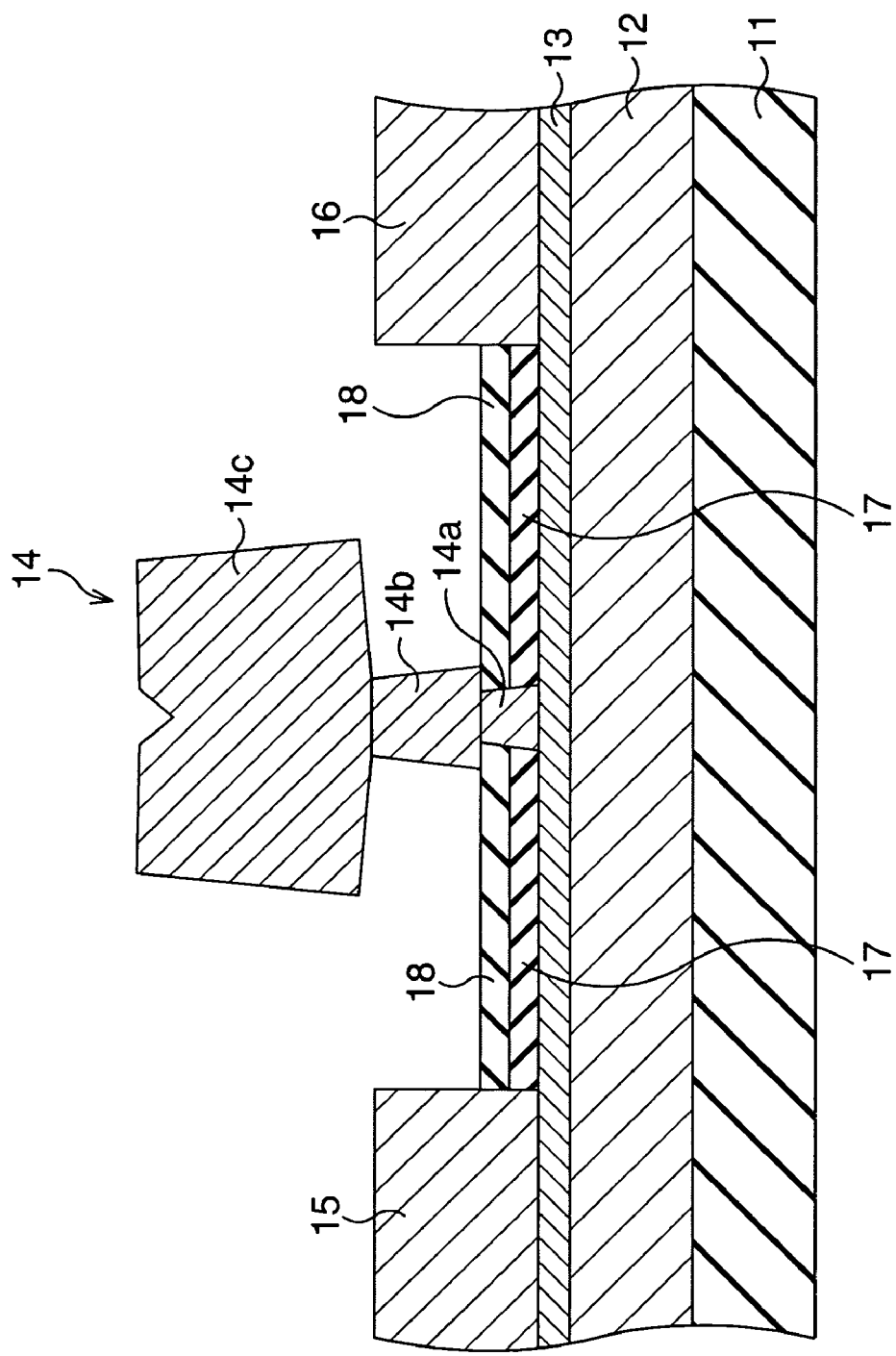
FIG. 8 is a cross-sectional view showing a semiconductor device (HEMT) according to a second embodiment of the present invention.

Next, a second embodiment of the present invention will be described. FIG. 8 is a cross-sectional view showing a semiconductor device according to the second embodiment of the present invention.

In this embodiment, the barrier layer 13 is covered by a protective film (passivation film) constituted by an $SiO_2$ film 17 and an SiN film 18. Accordingly, the barrier layer 13 is protected from contamination and the like from the outside. Incidentally, the reason of making the protective film have the double layer structure of the $SiO_2$ film 17 and the SiN film 18 is that, for damage that occurs in the barrier layer 13 when the SiN film 18 is processed in a case that only the SiN film 18 is formed as the passivation film, occurrence of such damage can be prevented by forming the $SiO_2$ film 17 in advance.

Third Embodiment

Figure 9:
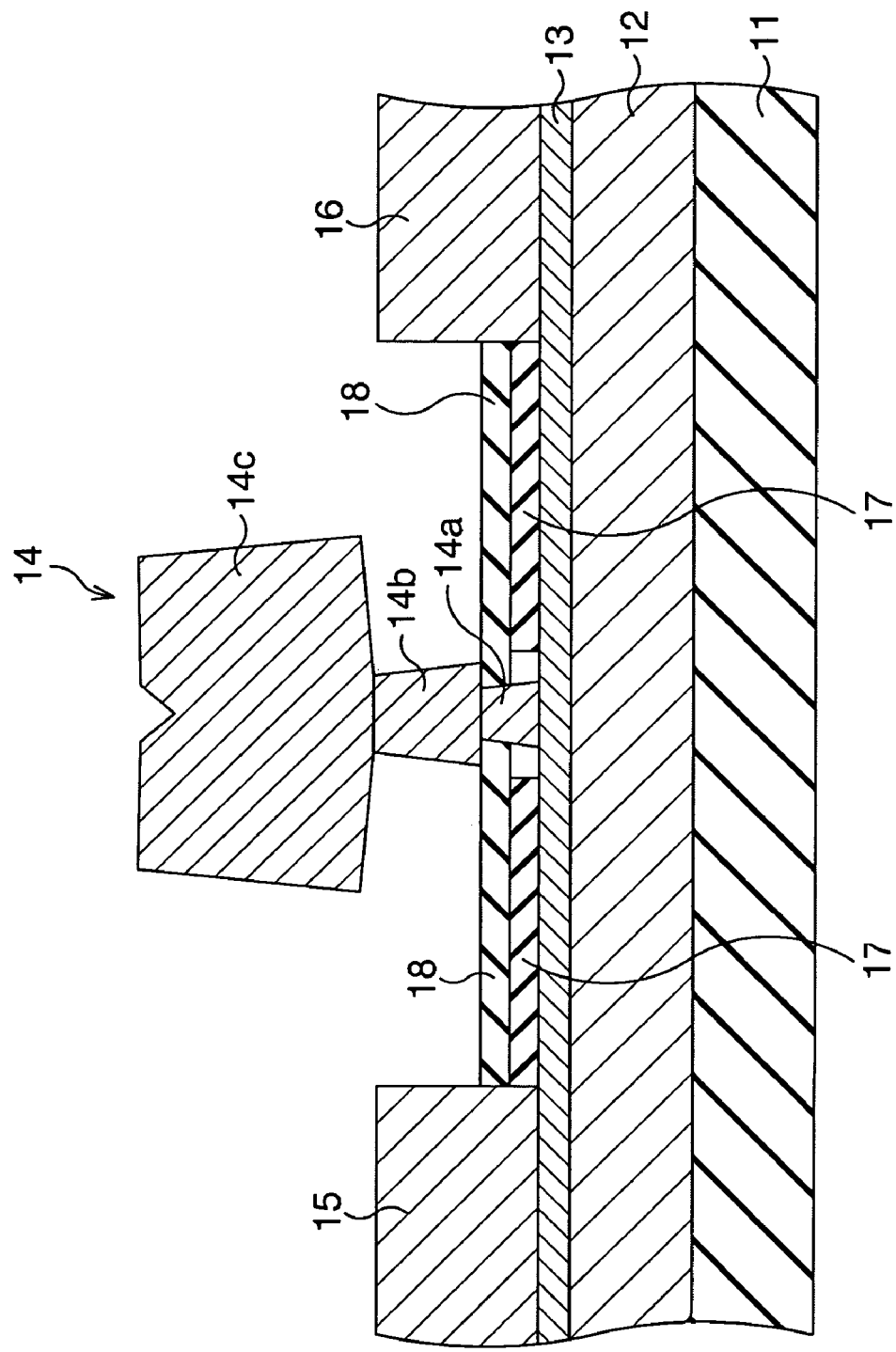
FIG. 9 is a cross-sectional view showing a semiconductor device (HEMT) according to a third embodiment of the present invention.

Next, a third embodiment of the present invention will be described. FIG. 9 is a cross-sectional view showing a semiconductor device according to the third embodiment of the present invention.

In this embodiment, as compared to the second embodiment, end portions on the gate electrode 14 side of the $SiO_2$ films 17 are separated from side surfaces of the gate electrode 14. In other words, there exist gaps between the $SiO_2$ films 17 and the gate electrode 14. When a protective film exists, the surface potential $\Phi_S$ of the semiconductor constituting the barrier layer 13 becomes higher as compared to a state that the protective film does not exist. Accordingly, in the second embodiment, as compared to the first embodiment, the work function $\Phi_M$ of the metal constituting the gate electrode 14 needs to be larger by an amount of increase of the surface potential $\Phi_S$ so that the option of the material becomes limited. In contrast, in this embodiment, increase of the surface potential $\Phi_S$ is suppressed, so that the option of the material can be secured more than in the second embodiment.

Fourth Embodiment

Figure 10:
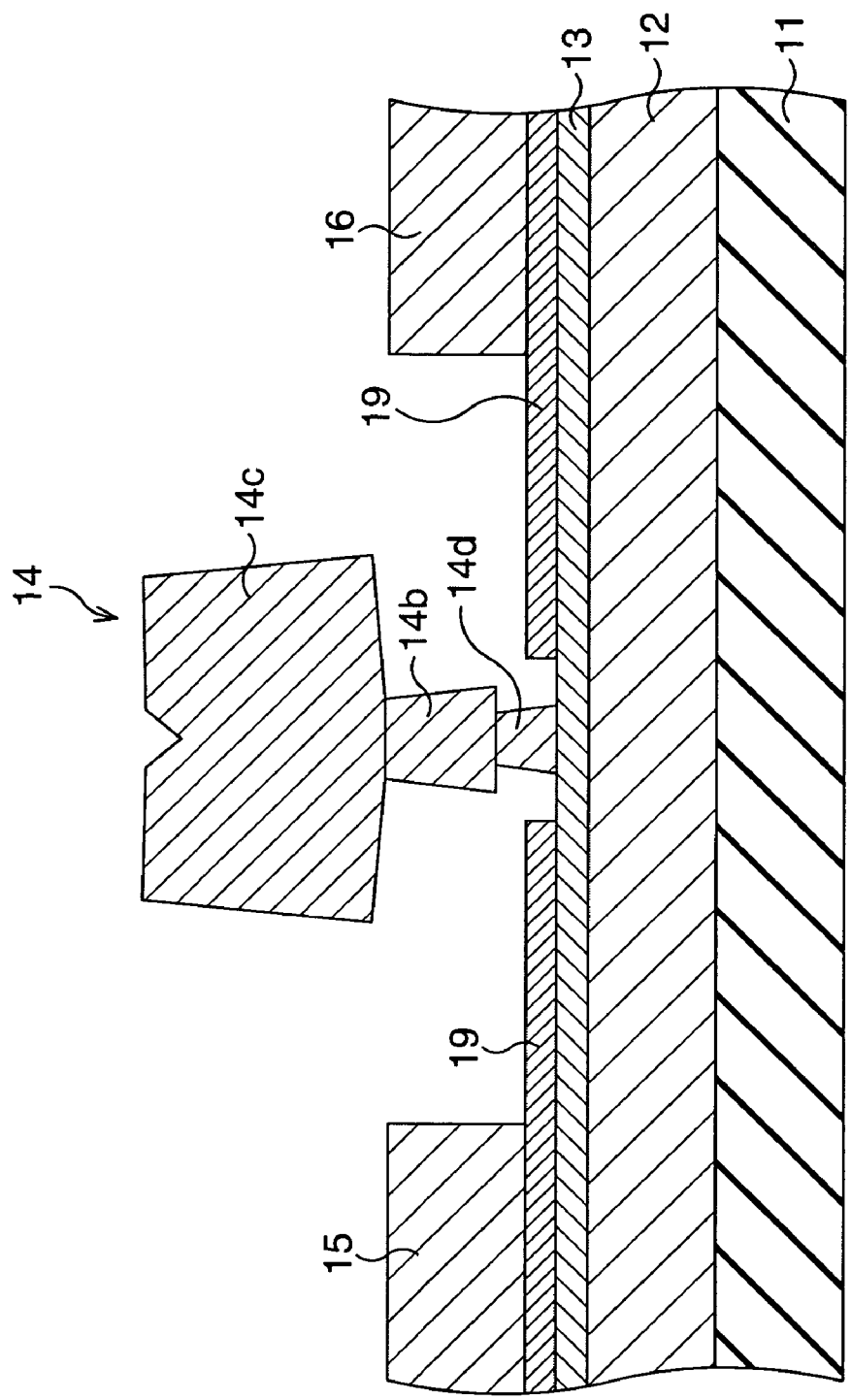
FIG. 10 is a cross-sectional view showing a semiconductor device (HEMT) according to a fourth embodiment of the present invention.

Next, a fourth embodiment of the present invention will be described. FIG. 10 is a cross-sectional view showing a semiconductor device according to the fourth embodiment of the present invention.

In this embodiment, there are formed cap layers 19 between the buffer layer 13 and the source electrode 15, and between the buffer layer 13 and the drain electrode 16. The cap layers 19 are each constituted by, for example, an $n^+$-GaN layer, which has a lower resistance than the buffer layer 13, and a thickness thereof is approximately 20 nm. The cap layers 19 are formed by, for example, an epitaxial growth method. Further, the bottom layer of the gate electrode 14 is constituted by an Ni layer 14d instead of the Mo layer 14a.

In the fourth embodiment configured as above, the existence of the cap layers 19 lowers the ohmic contact resistance between the source electrode 15 and drain electrode 16, and the semiconductor layer.

To obtain the structure in the fourth embodiment, for example, after the $n^+$-GaN layer constituting the cap layers 19 is formed on the entire surface, selective etching (recess etching) is performed on the $n^+$-GaN layer, and thereafter the gate electrode 14 is formed on the barrier layer 13 exposed through the $n^+$-GaN layer.

Incidentally, when the HEMTs according to the first to fourth embodiments are manufactured, it is preferable that thermal processing of 500° C. or higher, for example, is performed on the gate electrode 14 after the gate electrode 14 is formed. By performing such thermal processing, an oxide film, a transformed layer or the like existing on an interface between the semiconductor and the gate metal is removed, and thus a relatively clean metal-semiconductor interface is obtained. As a result, adhesiveness becomes better and the gate electrode characteristic becomes more stable, so that gate leak current is reduced, and there may even be a case that returning of the Schottky barrier height to an original value is possible. For example, in the fourth embodiment, in a case that such thermal processing is performed, the gate leak current is lower by approximately two orders of magnitude in comparison with a case that such thermal processing is not performed.

Further, in the second and third embodiments, a cap layer may be formed between the source electrode and drain electrode and the barrier layer similarly to the fourth embodiment. Further, although the kind of the metal constituting the gate electrode is not particularly limited, it is preferable that a portion making a Schottky junction with the barrier layer is constituted by Mo, Pt, Ni, Ti, or Pd. Work functions of the Mo, Ni, and Ti are 4.6 (eV), 5.2 (eV), and 4.3 (eV), respectively. Furthermore, when the portion of the gate electrode making the Schottky junction with the barrier layer is an Mo layer, it is preferable that a Pt layer exists thereon, and it is more preferable that a metal layer of a low resistance metal such as Au, Cu, Al or the like further exists thereon. Further, the gate electrode may be constituted by an Ni layer and an Au layer formed thereon. Incidentally, a gate electrode having a stacked structure of these layers can be formed by sequentially depositing them from a lower layer side.

Further, in the first to fourth embodiments, the positions of the AlGaN layer (barrier layer 13 (electron supplying layer)) and the GaN layer (buffer layer 12 (electronic channel)) may be replaced to form a structure that the gate electrode is formed on the GaN layer with a Schottky junction intervening therebetween. Further, the kind of a nitride-system compound semiconductor constituting the second compound semiconductor layer connected to the gate electrode by the Schottky junction is not particularly limited, and GaN, InN, AlN, a mixed crystal of these (AlGaN, for example) or the like may be used for example.

Furthermore, according to the above-described finding, the threshold voltage varies according to the kind of the metal constituting the gate electrode, so that it is easy to form an HEMT of depletion type in parallel to the enhancement type HEMT according to the first to fourth embodiments on the same substrate. Specifically, when only the step of forming the gate electrode is performed independently between the enhancement type HEMT and the depletion type HEMT, other steps such as forming the buffer layer 12, forming the barrier layer 13, and so on can be performed simultaneously.

Further, when these embodiments are applied to an analog circuit, element operation by one power source having the less number of parts becomes possible. Furthermore, also possible are development of new application as a power element for mobile terminals, and development to a large-scale digital integrated circuit having low power consumption and including the enhancement type HEMT and the depletion type HEMT.

Incidentally, not only the second semiconductor layer, but also the first compound semiconductor layer may be a nitride-system compound semiconductor.

Incidentally, in the above-described patent document 1 to patent document 4, it is disclosed that a gate electrode constituted by a high melting point metal such as Mo or the like is formed on the GaAs-system semiconductor layer to thereby form a Schottky gate that is thermally stable. However, the Schottky barrier potential (height) between the metal constituting the gate electrode and the semiconductor layer is not considered whatsoever. In contrast, the present invention uses a nitride-system semiconductor having different characteristics from those of the GaAs as the compound semiconductor, and utilizes changes of the inherent Schottky barrier height generated between the nitride-system semiconductor and metals as shown in FIG. 2 and FIG. 3. Therefore, the present invention cannot be easily devised at least from the above-described patent document 1 to patent document 4.

According to the present invention, the thickness of the second compound semiconductor layer is equal to or less than the thickness determined according to the work function of the metal constituting the gate electrode, so that, from a reverse point of view, a gate electrode constituted by a metal having a work function determined according to the thickness of the second compound semiconductor layer is used. Accordingly, even when a recess structure does not exist on the surface of the second compound semiconductor layer, an HEMT that appropriately performs enhancement operation can be obtained only by adjusting the thickness of the second compound semiconductor layer and/or by selecting a metal constituting the gate electrode. Specifically, since the recess structure becomes unnecessary, the above-described HEMT can be easily obtained.

Incidentally, the thickness determined according to the work function of a metal (thickness of the second compound semiconductor layer) is, for example, a thickness that makes the threshold voltage of the HEMT having the first and second compound semiconductor layers and the gate electrode substantially 0 (zero) volt.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
    a first compound semiconductor layer;
    a nitride-system second compound semiconductor layer formed on said first compound semiconductor layer via a hetero junction;
    a gate electrode formed on said second compound semiconductor layer via a Schottky junction; and
    a source electrode and a drain electrode formed sandwiching said gate electrode,
    a thickness of said second compound semiconductor layer being equal to or less than a thickness determined according to a work function of a metal constituting said gate electrode.

2. The semiconductor device according to claim 1, wherein electric current does not flow between said source electrode and said drain electrode during a state that a voltage is not applied to said gate electrode.

3. The semiconductor device according to claim 1, wherein a thickness of said second compound semiconductor layer is substantially constant between a portion beneath said source electrode and a portion beneath said drain electrode.

4. The semiconductor device according to claim 1, wherein when a positive voltage is applied to said gate electrode, electric current flows between said source electrode and said drain electrode.

5. The semiconductor device according to claim 1, wherein a Schottky barrier potential of said gate electrode is higher than a surface potential of said second compound semiconductor layer on both sides of said gate electrode.

6. The semiconductor device according to claim 1, wherein said gate electrode is formed directly on said second compound semiconductor layer, and comprises a metal layer of at least one layer constituted by one type of metal selected from a group consisting of molybdenum, platinum, nickel, and palladium.

7. The semiconductor device according to claim 1, wherein said gate electrode comprises:

a molybdenum layer formed directly on said second compound semiconductor layer; and a platinum layer formed on said molybdenum layer.

8. The semiconductor device according to claim 7, wherein said gate electrode comprises a metal layer formed on said molybdenum layer, and constituted by one type of metal selected from a group consisting of gold, copper, and aluminum.

9. The semiconductor device according to claim 1, wherein said gate electrode comprises:

a nickel layer formed directly on said second compound semiconductor layer; and a gold layer formed on said nickel layer.

10. The semiconductor device according to claim 1, wherein said second compound semiconductor layer is constituted by one type of compound semiconductor selected from a group consisting of gallium nitride, indium nitride, aluminum nitride, and a mixed crystal including at least two of the gallium nitride, the indium nitride, and the aluminum nitride.

11. The semiconductor device according to claim 1, wherein a Schottky barrier potential of said gate electrode is equal to or larger than a value represented by $\Delta Ec/q+d\times P/\kappa$, where: a piezoelectric polarization of a compound semiconductor constituting said second compound semiconductor layer is P, a relative dielectric constant thereof is $\kappa$, a thickness thereof is d, an energy gap of a hetero junction between said first compound semiconductor layer and said second compound semiconductor layer is $\Delta Ec$, and an electric charge is q.

12. The semiconductor device according to claim 1, further comprising an insulative film covering said second compound semiconductor layer.

13. The semiconductor device according to claim 12, wherein a gap exists between said insulating film and said gate electrode in the vicinity of a lower end of said gate electrode.

14. The semiconductor device according to claim 1, further comprising a third compound semiconductor layer formed between said second compound semiconductor layer, and said source electrode and said drain electrode, said third compound semiconductor having a resistance lower than a resistance of said second compound semiconductor layer.

15. A method for manufacturing a semiconductor device, comprising the steps of:

forming a first compound semiconductor layer;

forming a nitride-system second compound semiconductor layer on the first compound semiconductor layer via a hetero junction; and forming a gate electrode on the second compound semiconductor layer via a Schottky junction, a thickness of the second compound semiconductor layer being equal to or less than a thickness determined by a work function of a metal constituting the gate electrode.

16. The method for manufacturing a semiconductor device according to claim 15, further comprising, after said step of forming the gate electrode, the step of performing thermal processing on the gate electrode.

17. The method for manufacturing a semiconductor device according to claim 15, wherein said step of forming the gate electrode comprises the step of forming a metal layer constituted by one type of metal selected from a group consisting of molybdenum, platinum, nickel, and palladium directly on the second compound semiconductor layer.

18. The method for manufacturing a semiconductor device according to claim 15, wherein said step of forming the gate electrode comprises the steps of:

forming an molybdenum layer directly on the second compound semiconductor layer; and forming a platinum layer on the molybdenum layer.

19. The method for manufacturing a semiconductor device according to claim 18, wherein said step of forming the gate electrode comprises the step of forming a metal layer constituted by one type of metal selected from a group consisting of gold, copper, and aluminum on the platinum layer.

20. The method for manufacturing a semiconductor device according to claim 15, wherein the second compound semiconductor layer is constituted by one type of compound semiconductor selected from a group consisting of gallium nitride, indium nitride, aluminum nitride, and a mixed crystal including at least two of the gallium nitride, the indium nitride, and the aluminum nitride.

* * * * *